United States Patent
Dong

(10) Patent No.: US 11,031,281 B2
(45) Date of Patent: Jun. 8, 2021

(54) SEMICONDUCTOR DEVICES AND METHODS OF FABRICATING A DEEP TRENCH ISOLATION STRUCTURE

(71) Applicant: GLOBALFOUNDRIES Singapore Pte. Ltd., Singapore (SG)

(72) Inventor: Ke Dong, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/430,520

(22) Filed: Jun. 4, 2019

(65) Prior Publication Data

US 2020/0388527 A1     Dec. 10, 2020

(51) Int. Cl.
*H01L 21/762*     (2006.01)
*H01L 23/544*     (2006.01)

(52) U.S. Cl.
CPC ...... *H01L 21/76224* (2013.01); *H01L 23/544* (2013.01); *H01L 2223/54426* (2013.01)

(58) Field of Classification Search
CPC .............. H01L 21/76224; H01L 23/544
See application file for complete search history.

(56) References Cited

U.S. PATENT DOCUMENTS

| | | | |
|---|---|---|---|
| 8,298,889 B2 * | 10/2012 | Roig-Guitart | H01L 29/0653 438/242 |
| 9,385,190 B2 | 7/2016 | Pigott et al. | |
| 9,673,084 B2 | 6/2017 | Liu et al. | |
| 2004/0248364 A1 * | 12/2004 | Hsiao | H01L 27/10867 438/243 |
| 2006/0030142 A1 * | 2/2006 | Grebs | H01L 29/7811 438/618 |
| 2007/0045769 A1 * | 3/2007 | Bian | H01L 29/0649 257/510 |
| 2012/0161154 A1 * | 6/2012 | Mimura | H01L 29/7813 257/77 |
| 2014/0220761 A1 * | 8/2014 | Molloy | H01L 29/0619 438/430 |
| 2014/0264453 A1 * | 9/2014 | Moens | H01L 21/8252 257/194 |
| 2017/0179133 A1 * | 6/2017 | Ruffell | H01L 27/10826 |
| 2020/0052110 A1 * | 2/2020 | Feil | H01L 29/513 |

* cited by examiner

*Primary Examiner* — Christine A Enad
(74) *Attorney, Agent, or Firm* — Viering Jentschura & Partner MBB

(57) ABSTRACT

According to various embodiments, a semiconductor device may include: a semiconductor substrate; a deep trench extending from a first portion of the semiconductor substrate to a second portion of the semiconductor substrate, wherein the second portion underlies the first portion; and an insulator region at least substantially lining sides of the deep trench. The insulator region includes at least one shallow trench in the first portion of the semiconductor substrate. At least a portion of the shallow trench(es) is arranged over at least a portion of the deep trench.

20 Claims, 10 Drawing Sheets

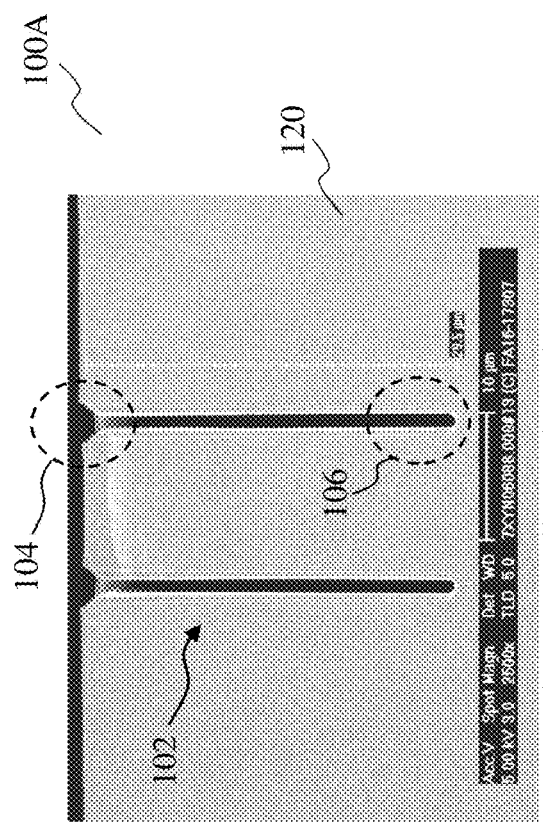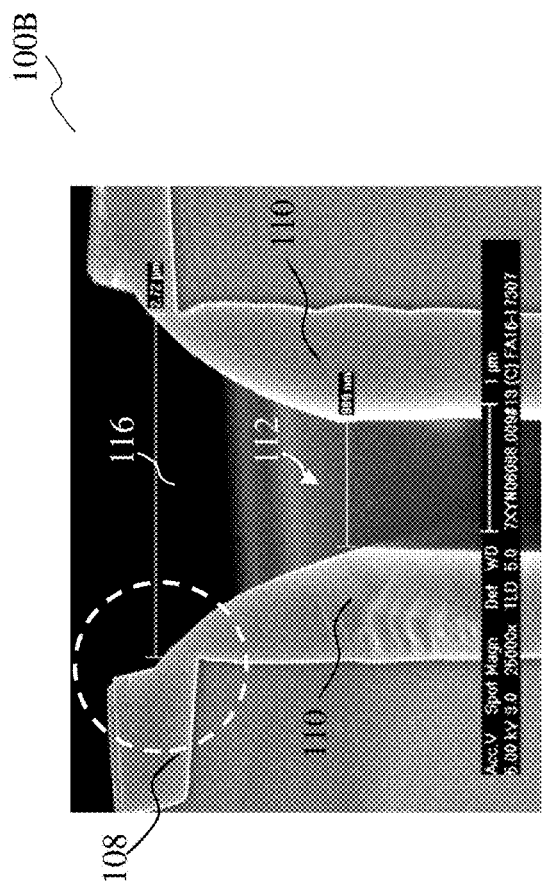
FIG. 1A (Prior Art)
FIG. 1B (Prior Art)

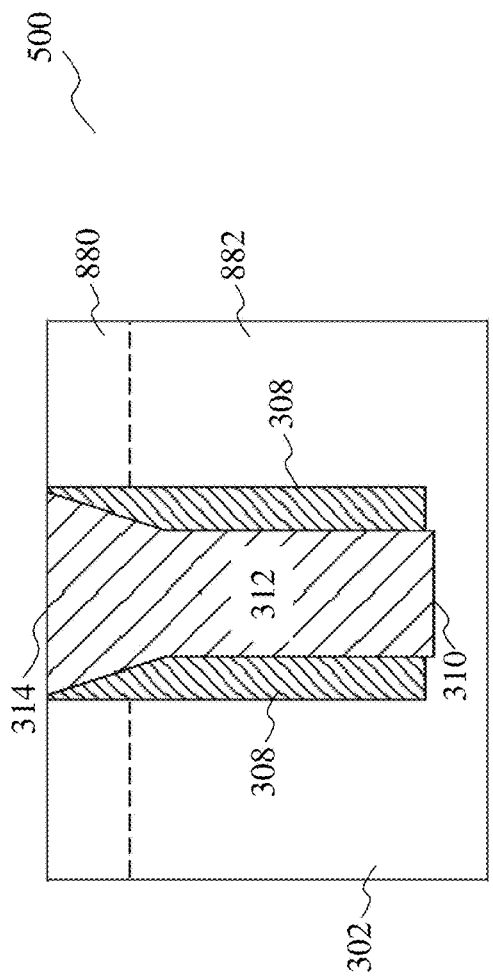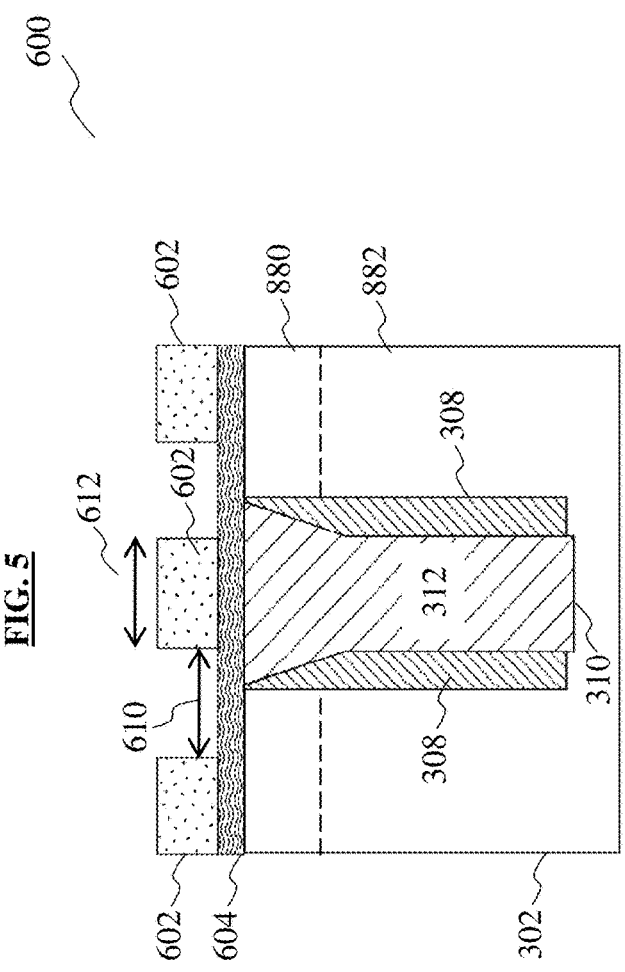

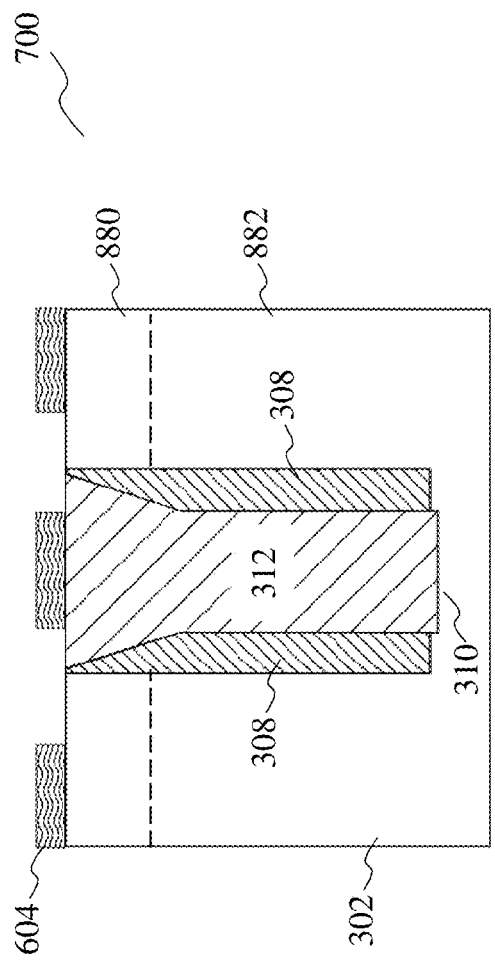
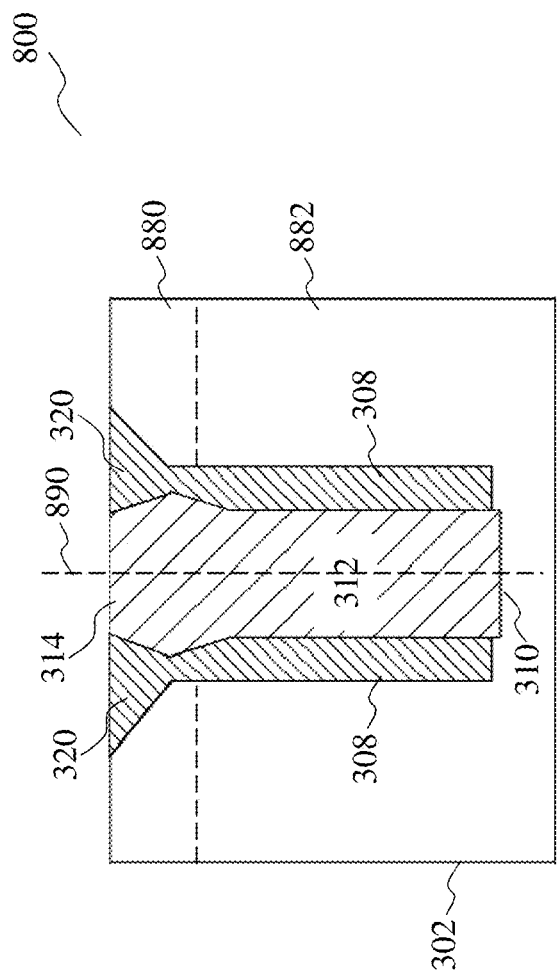

1100

1102 — Form a deep trench, the deep trench extending from a first portion of the semiconductor substrate to a second portion of the semiconductor substrate, wherein the second portion underlies the first portion.

1104 — Form an insulator region at least substantially lining sides of the deep trench; wherein the insulator region comprises at least one shallow trench in the first portion of the semiconductor substrate; wherein at least a portion of the at least one shallow trench is arranged over at least a portion of the deep trench.

FIG. 11

SEMICONDUCTOR DEVICES AND METHODS OF FABRICATING A DEEP TRENCH ISOLATION STRUCTURE

TECHNICAL FIELD

Various embodiments relate to deep trench isolation structures and methods of fabricating deep trench isolation structures.

BACKGROUND

As the demand for smaller integrated circuits rises, there is an increasing range of applications for high voltage (HV) devices, for example, high-power transistors. As such, it may be desirable to arrange HV devices compactly on a single chip. However, it may be challenging to electrically isolate closely packed HV devices as conventional isolation structures may not meet the high breakdown voltage requirement of HV devices.

SUMMARY

According to various embodiments, there may be provided a semiconductor device. The semiconductor device may include: a semiconductor substrate, and a deep trench extending from a first portion of the semiconductor substrate to a second portion of the semiconductor substrate. The second portion underlies the first portion, and an insulator region at least substantially lines sides of the deep trench. The insulator region may include at least one shallow trench in the first portion of the semiconductor substrate where at least a portion of the shallow trench(es) is arranged over at least a portion of the deep trench.

According to various embodiments, there may be provided a method of fabricating a deep trench isolation structure in a semiconductor substrate. The method may include: forming a deep trench that extends from a first portion of the semiconductor substrate to a second portion of the semiconductor substrate where the second portion underlies the first portion. The method may further include forming an insulator region at least substantially lining sides of the deep trench. The insulator region may include at least one shallow trench in the first portion of the semiconductor substrate. At least a portion of the shallow trench(es) may be arranged over at least a portion of the deep trench.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 1A shows a Scanning Electrode Microscope (SEM) image of a prior art DTI structure formed in a substrate.

FIG. 1B shows a magnified view of the top portion of FIG. 1A.

FIGS. 3 to 8 illustrate cross-sectional views of a semiconductor device, to show a method of fabricating a DTI structure according to various non-limiting embodiments.

FIG. 11 illustrates a flow diagram of a method of fabricating a DTI structure according to various non-limiting embodiments.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

In order that the invention may be readily understood and put into practical effect, various embodiments will now be described by way of examples and not limitations, and with reference to the figures.

Figure 1C:
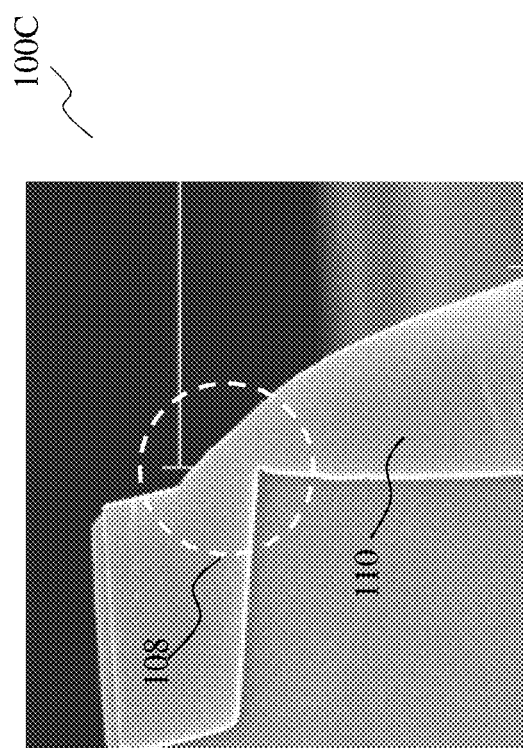
FIG. 1C shows a further magnified view of the top portion of FIG. 1B.

FIG. 1A shows a Scanning Electrode Microscope (SEM) image 100A of a prior art DTI structure 102 formed in a substrate 120. A top portion 104 and a bottom portion 106 of the prior art DTI structure 102 are described further with respect to FIGS. 1B and 1C. The top portion 104 may include a top end, also referred herein as an opening, of the DTI structure 102. The bottom portion 104 may include a terminating end, also referred herein as a closed end, of the DTI structure 102.

FIG. 1B shows a magnified view 100B of the top portion 104 of FIG. 1A. The enlarged view 100B shows that the DTI structure 102 includes a deep trench 112 that has its inner walls lined with an oxide region 110. The deep trench 112 is wider at the opening and tapers off to a narrower width as it extends into the substrate 120. The oxide region 110 at a top corner is referred herein as the top corner oxide 108. The top corner oxide 108 is adjacent to the opening 116. The top corner oxide 108 is thinner than the oxide region 110 lining the rest of the deep trench 112.

FIG. 1C shows a further magnified view 100C of the top portion 104 of FIG. 1B. The view 100C shows that the top corner oxide 108 is especially narrow in width. This narrow region of the oxide region 110 has a higher risk of breakdown when it is exposed to high voltage. The voltage at which the oxide region 110 breaks down may be referred to as the breakdown voltage. The oxide region 110 may serve as an electrical insulator. With the breakdown of the top corner oxide 108, electricity may leak through the top corner of the DTI 102 from one semiconductor device to another semiconductor device formed in the same substrate 120 or on the same semiconductor die.

Figure 1D:
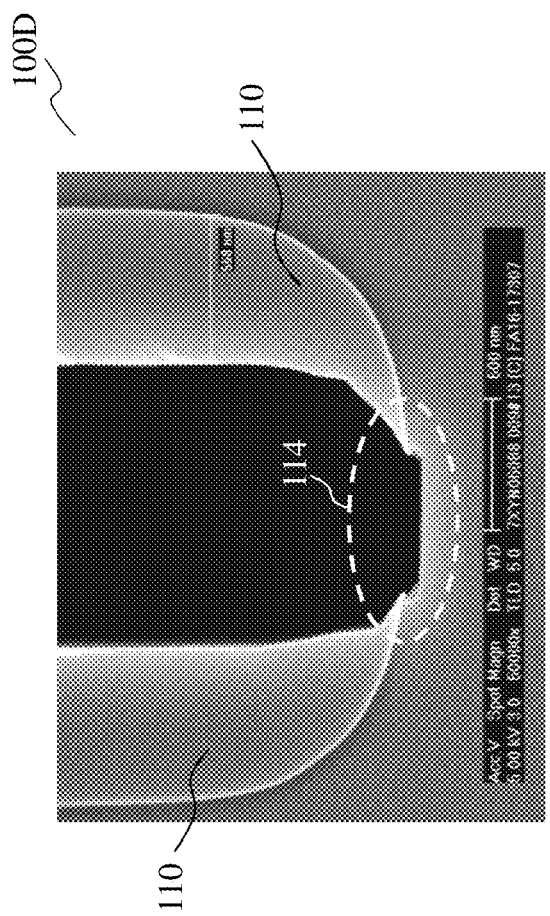
FIG. 1D shows a magnified view of the bottom portion of FIG. 1A.

FIG. 1D shows a magnified view 100D of the bottom portion 106 of FIG. 1A. The view 100D shows that the oxide region 110 is etched away at the terminating end 114. It is challenging to optimize the thickness of the oxide region 110 because the oxide region 110 at the terminating end 114, also referred herein as the bottom oxide, needs to be etched away, while the top corner oxide 108 should preferably be thick to prevent breakdown at high voltages. The oxide region 110 may be formed by depositing about 4 kÅ of oxide and about 7 kÅ of Tetraethyl orthosilicate (TEOS). After the deposition processes, the resulting oxide region 110 may be thicker at the terminating end 114 than at the side walls of the deep trench. As such, a strong etching process may be required, to remove the bottom oxide. The bottom oxide may be etched through by etch back. The precision required for the processes of depositing the oxide and the TEOS, as well as the process of etching away the bottom oxide, may be very high, so as to keep the top corner oxide sufficiently thick while being able to etch through the bottom oxide with enough margin. In other words, the allowable process margins may be very low.

Figure 2A:
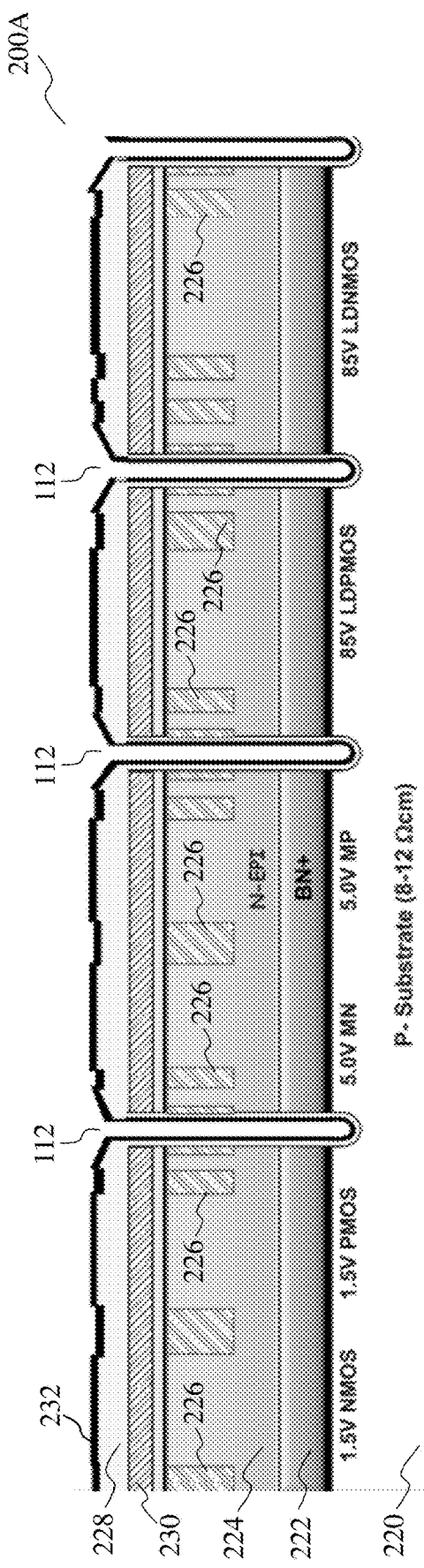
FIGS. 2A to 2C illustrate a prior art method of fabricating a DTI structure.
Figure 2B:
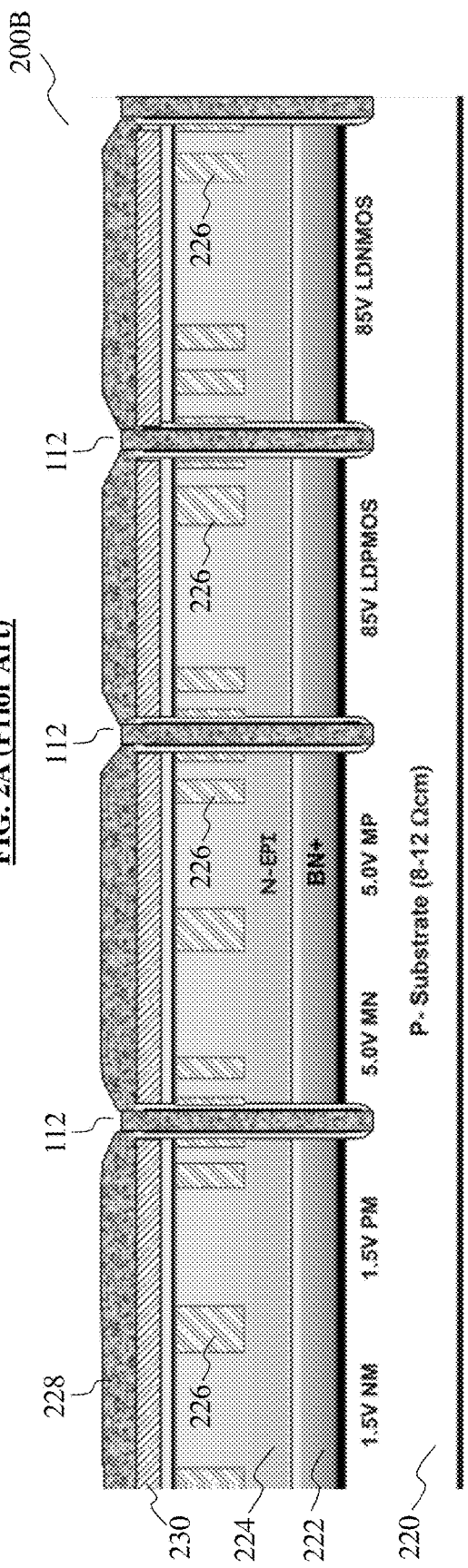
Figure 2C:
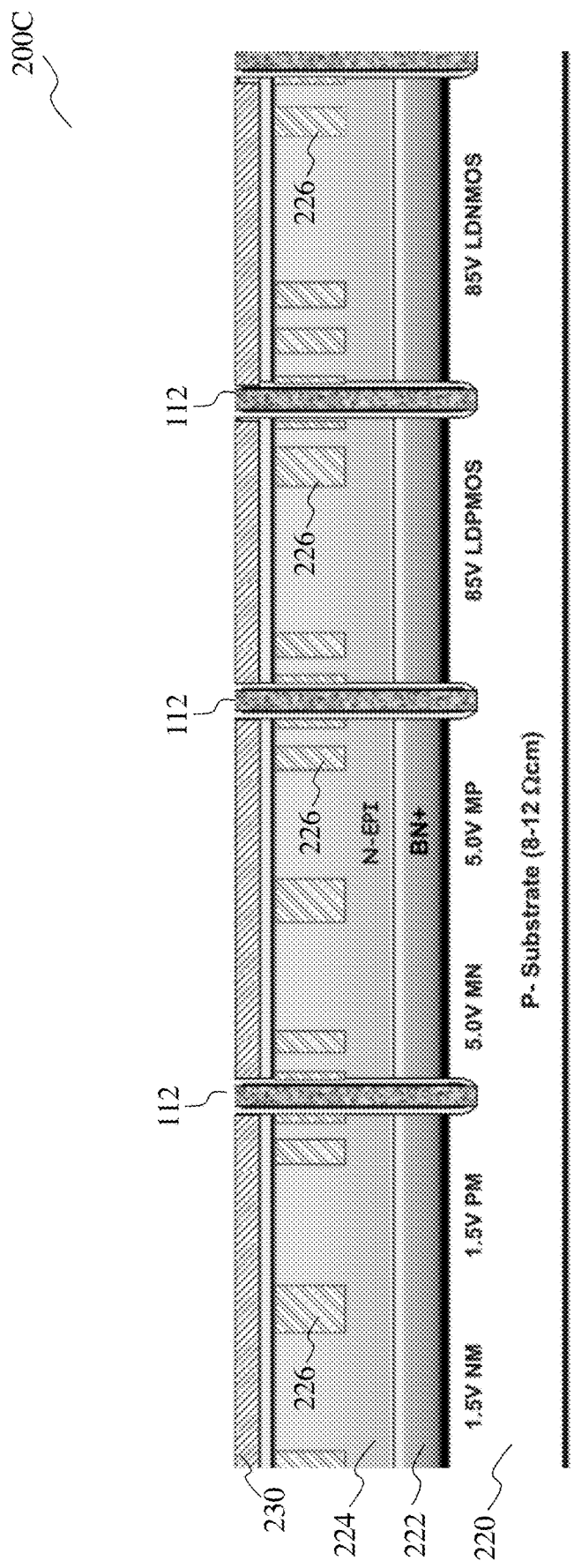

FIGS. 2A to 2C illustrate a prior art method of fabricating a DTI structure 102.

FIG. 2A illustrates a cross-sectional view 200A of a device in a first step of the prior art method. The device may include a base substrate 220. The base substrate 220 may be a silicon substrate. The base substrate may be a doped substrate, such as a lightly-doped p-type substrate. The base substrate 220 may have a resistivity of about 8 to about 12 Ωcm. The device may also include a buried layer 222 formed over the base substrate 220. The buried layer 222 may be an n-type buried layer for a p-type base substrate 220. The device may include an epitaxial layer 224 formed over the buried layer 222. The base substrate 220, the buried layer 222 and the epitaxial layer 224 may be referred to as the substrate of the device. The epitaxial layer 224 may be doped to have the same polarity type as the buried layer 222. A plurality of shallow trenches 226 may be provided in the epitaxial layer 224. A hard mask layer 230 may be provided over a top surface of the epitaxial layer 224. The hard mask layer 230 may be a silicon nitride hard mask. A layer of polysilicon 228 may be deposited over the hard mask layer 230. A plurality of deep trenches 112 that extends from a top surface of the polysilicon 228 down to the base substrate 220 may be formed, by etching the polysilicon 228, the epitaxial layer 224 and the buried layer 222 using the hard mask layer 230. The deep trenches 112 may be pre-cleaned before an oxide is deposited. TEOS of about 7 kÅ in thickness and an oxide material of about 4 kÅ in thickness may be deposited over the polysilicon 228 to form an oxide layer 232. The oxide layer 232 may extend into the deep trenches 112, to line the walls of the deep trenches 112.

FIG. 2B illustrates a cross-sectional view 200B of a device in a second step of the prior art method. The oxide layer 232 may be planarized by etching back. The TEOS may go through a densification process, which may include heating to 1050° C. for about two hours. The deep trenches 112 may be etched to remove the bottom oxide in the deep trenches 112. The deep trenches 112 may be deposited with polysilicon of 16 kÅ thickness which may be doped in-situ to a resistivity of about 25-30 Ω/sq. Prior to the deposition of the polysilicon, the deep trenches 112 may be precleaned to remove oxidation. The polysilicon 228 may also be doped in-situ to form doped polysilicon 228'.

FIG. 2C illustrates a cross-sectional view 200C of a device in a third step of the prior art method. The doped polysilicon 228' may be removed by chemical-mechanical polishing (CMP) until the mask layer 230, to provide a planar surface. Excess polysilicon that extends out of the planar surface from the deep trenches 112 may be removed by wet etching. The device may include transistors, such as metal-oxide-semiconductor field-effect transistors (MOSFET). The transistors may include N-type MOSFET (NMOS), P-type MOSFET (PMOS), lateral double-diffused P-type MOSFET (LDPMOS) and lateral double-diffused N-type MOSFET (LDNMOS). The transistors may include low voltage (LV) transistors, for example, a 1.5V NMOS and a 1.5V PMOS. The transistors may also include medium voltage (MV) transistors, for example, a 5.0V NMOS and a 5.0V PMOS. The transistors may also include high voltage (HV) transistors, for example, an 85V LDPMOS and an 85V LDNMOS. Following the third step, the hard mask layer 230 may be removed.

FIGS. 3 to 8 illustrate cross-sectional views of a semiconductor device, to show a method of fabricating a DTI structure according to various non-limiting embodiments.

According to various non-limiting embodiments, a method for fabricating a DTI structure may include increasing the thickness of the DTI top corner oxide to improve the isolation BV margin. The method may include forming DTI structure(s) in a semiconductor substrate, prior to forming shallow trench isolation (STI) structure(s) in the semiconductor substrate. At least one of the STI structures may adjoin the opening of the DTI such that it is contiguous with the top corner oxide. The STI structure may be filled with the same insulator material as the oxide region such that the STI structure widens the top corner oxide. The bottom oxide may be etched away prior to the formation of the STI structure. As such, the process margin may be increased, since the thickness of the top corner oxide may depend on the formation of the STI structure, rather than the etching process.

According to various non-limiting embodiments, a method for fabricating a semiconductor device may be provided. The method may include fabricating DTI structures, before fabricating STI structures. The method may include forming STI structures that conjoin the oxide region at the top corner of the DTI structures, so as to enlarge the top corner oxide region.

Figure 3:
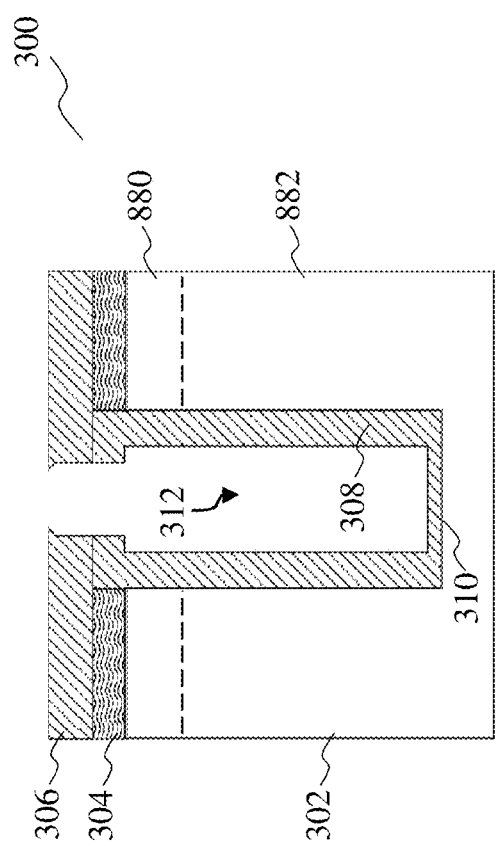

FIG. 3 illustrates a cross-sectional view 300 that shows a process in the method of fabricating a DTI structure. A substrate 302 may be provided. The substrate 302 may include a semiconductor material, such as silicon. The substrate 302 may be a silicon-on-insulator (SOI) substrate. The substrate 302 may include a first portion 880, which may be lightly doped. The first portion 880 may be an epitaxial silicon layer. The substrate 302 may further include a second portion 882 that underlies the first portion 880. The second portion 882 may include a heavily doped region. The second portion 882 may further include a buried insulator layer, for example, a buried oxide layer of the SOI substrate. The second portion 882 may further include a base substrate underneath the buried insulator layer. A nitride region 304, for example, silicon nitride, may be provided above the substrate 302. The nitride region 304 may serve as an etching mask. A deep trench 312 may be etched into the substrate 302. The deep trench 312 may be etched from the first portion 880 and into the second portion 882. The deep trench 312 may be about 4 to 10 um deep in a non-limiting embodiment. The deep trench 312 may be formed through the first portion 880 and through part of the second portion 882, for example, through the buried insulator layer to reach the base substrate. An insulator material, for example, an oxide such as silicon oxide, may be deposited such that the insulator material coats the inner walls of the deep trench 312 to form an insulator region 308. The insulator material may also coat a bottom, also referred herein as the closed end or the terminating end 310, of the deep trench 312. The insulator material may also form a thin layer 306 over the nitride region 304. The insulator material may also include TEOS. TEOS may be used as a source to deposit silicon oxide, via high density plasma (HDP), low pressure chemical vapor deposition (LPCVD) or plasma enhance chemical vapor deposition (PECVD) procedures.

Figure 4:
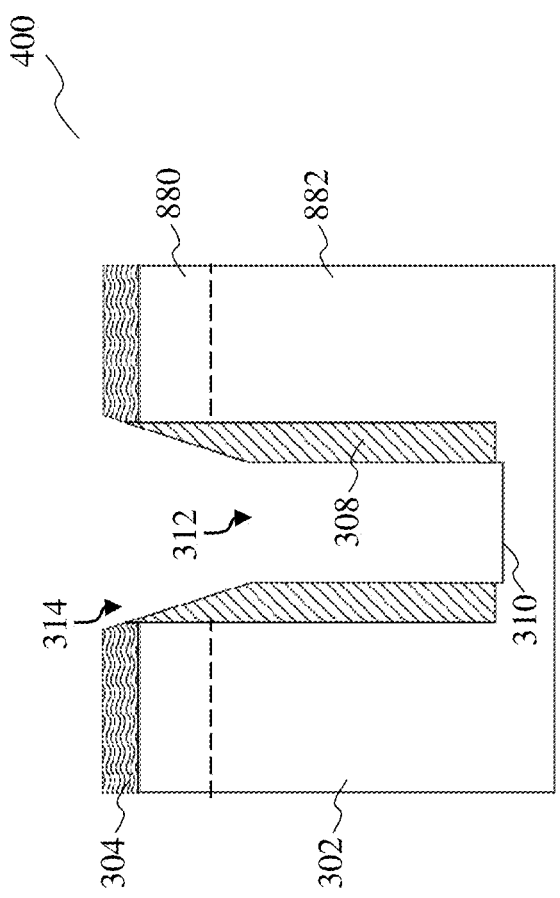

FIG. 4 illustrates a cross-sectional view 400 that shows a process in the method of fabricating a DTI structure. The deep trench 312 may be etched further, to remove the insulator material at the terminating end 310. As a result of the etching, an opening 314, also referred herein as top end of the deep trench 312, may be widened. The opening 314 may taper towards the terminating end 310. The etching may remove insulator material that lined a top portion of the deep trench 312. As a result, the insulator region that coats the walls of the deep trench 312 may be thicker nearer to the terminating end 310, and may be thinner nearer to the opening 314. The thin layer 306 of TEOS may be removed by etch back.

FIG. 5 illustrates a cross-sectional view 500 that shows a process in the method of fabricating a DTI structure. The deep trench 312 may be filled with a conductor material. The conductor material may include doped polysilicon. The nitride region 304 may be removed by etching. The conductor material may provide a ground connection to the base substrate of the second portion 882.

FIG. 6 illustrates a cross-sectional view 600 that shows a process in the method of fabricating a DTI structure. The process may be to prepare the substrate 302 for the fabricating of STI regions. A mask layer 604 may be deposited on the substrate 302. The first mask 604 may include silicon nitride. A plurality of oxide pads 612 may be deposited on the mask layer 604. The width 612 of the oxide pads may determine the spacing between STIs on the final DTI structure. In other words, the width 612 may determine the opening width of the final DTI structure. The width 612 may at least substantially range from about 1.0 um to about 3 um, for example, in a range from about 1.5 um to about 2.0 um. The spacing 610 between the oxide pads 602 may determine the width of the STIs on the edge of the final DTI structure. In other words, the spacing 610 may determine the width of the top corner oxide of the final DTI structure. The spacing 610 may at least substantially be in a range of more than 0.5 um, for example, in a range from about 0.5 um to about 1.5 um.

FIG. 7 illustrates a cross-sectional view 700 that shows a process in the method of fabricating a DTI structure. The process may include patterning the mask layer 604 using the oxide pads 602 as a mask. The mask layer 604 may include gaps that lie at least substantially directly above the insulator regions 308.

FIG. 8 illustrates a cross-sectional view 800 that shows a process in the method of fabricating a DTI structure. The process may include etching the substrate 302, the insulator region 308 and the conductive material in the deep trench 312, using the mask layer 604 as the etching mask. As a result of the etching, tapered shallow trenches 320 may be formed. One or more shallow trenches 320 may be formed. Two shallow trenches 320 may be formed in a non-limiting example where the deep trench 312 may be between the two shallow trenches 320. A centerline 890 through the deep trench 312 may be at least substantially parallel to a depth of the deep trench 312, and may be at least substantially perpendicular to a top surface of the substrate 302 that is coplanar with the top end 314. The centerline 890 may be at least substantially equidistant from the sidewalls of the deep trench 312. The shallow trenches 320 may be formed offset from the centerline 890. The shallow trenches 320 may be formed partially in the substrate 302, partially in the insulator region 308 and partially in the deep trench 312. The shallow trenches 320 may be formed such that at least a portion of each shallow trench 320 may be arranged over at least a portion of the deep trench 312. The process may further include depositing an insulator material into the shallow trenches, for example by high-density plasma chemical vapor deposition. The insulator material may have the same material composition as the insulator region 308. As a result, the insulator region 308 may be enlarged, at the sides of the opening 314 of the deep trench 312. The mask layer 604 may be removed, for example by CMP.

The same mask layer 604 may be used to form shallow trench isolation (STI) regions in other portions of the substrate 302 (not illustrated in the figure) in the same process. The deep trench 312 may be used as a zero-alignment mask for forming the STI regions. The STI regions may be filled with a dielectric material, for example the insulator material, for example silicon dioxide. The STI regions may be used to reduce parasitic capacitances and to provide voltage isolation between integrated devices in the semiconductor device.

The cross-section view 800 also shows the final DTI structure according to various non-limiting embodiments. The DTI structure may provide a relatively high voltage isolation between devices as compared to the STI regions, and as such, may be suitable for isolating high voltage devices formed on the same semiconductor device or substrate. The semiconductor device may include a plurality of circuit components or devices. A DTI structure may be arranged between adjacent circuit components to isolate the adjacent circuit components. The DTI structures may have a high aspect ratio, for example, about 10:1 or greater.

According to various non-limiting embodiments, the DTI structure may provide alignment marks for subsequent processes in the device fabrication. The DTI structure may be used as a zero-alignment mask. According to various non-limiting embodiments, the deep trench may have a depth ranging from about 4 um to about 30 um, for example 4 um to about 20 um, for example 4 um to 10 um.

According to various non-limiting embodiments, the deep trench may have a diameter ranging from about 0.5 um to about 5um, for example 0.5 um to about 3 um, for example 0.5 um to about 1.6 um.

According to various non-limiting embodiments, the shallow trench arranged over at least a portion of the deep trench may have a depth ranging from about 0.020 um to about 1 um, for example 0.025 um to about 0.5 um, for example 0.028 um to about 0.25 um.

According to various non-limiting embodiments, the shallow trench arranged over at least a portion of the deep trench may have a diameter ranging from about 0.020 um to about 1 um, for example 0.025 um to about 0.5 um, for example 0.028 um to about 0.25 um.

Figure 9:
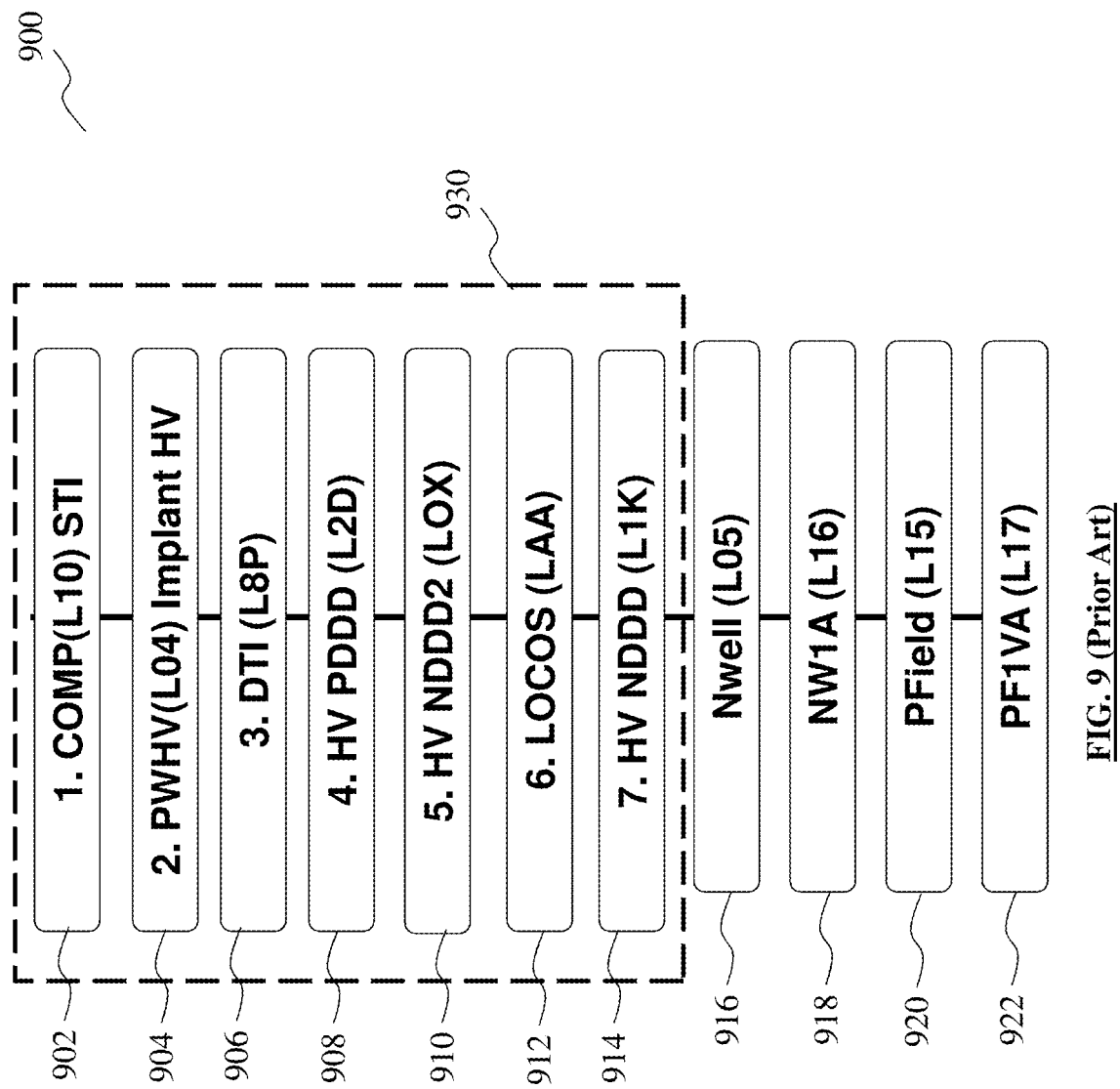
FIG. 9 illustrates a flow diagram of a prior art method of fabricating a DTI structure.

FIG. 9 illustrates a flow diagram 900 of a prior art method of fabricating a DTI structure. Process 902 may include forming STI regions in a semiconductor substrate. Process 904 may include ion implantation to form high voltage p-well (PWHV). Process 906 may include forming DTI structures. Process 908 may include forming P-type double diffused drain (PDDD). Process 910 may include forming N-type double diffused drain (NDDD). Process 912 may include local oxidation of silicon (LOCOS) to form insulating structures. Process 914 may include forming NDDD. The processes 904, 908, 910, 912 and 914 may be part of a process of fabricating transistors, which may include lateral diffused metal-oxide transistor (LDMOS). The STI regions formed in the process 902 may serve as a zero-alignment mask for the subsequent processes relating to fabrication of the transistors. Following process 914, processes 916 and 918 may include doping via implantation, of regions in the semiconductor substrate to form N-type well. Processes 920 and 922 may include doping via implantation, of regions in the semiconductor substrate to form P-type well. The processes may be carried out in the sequence shown.

Figure 10:
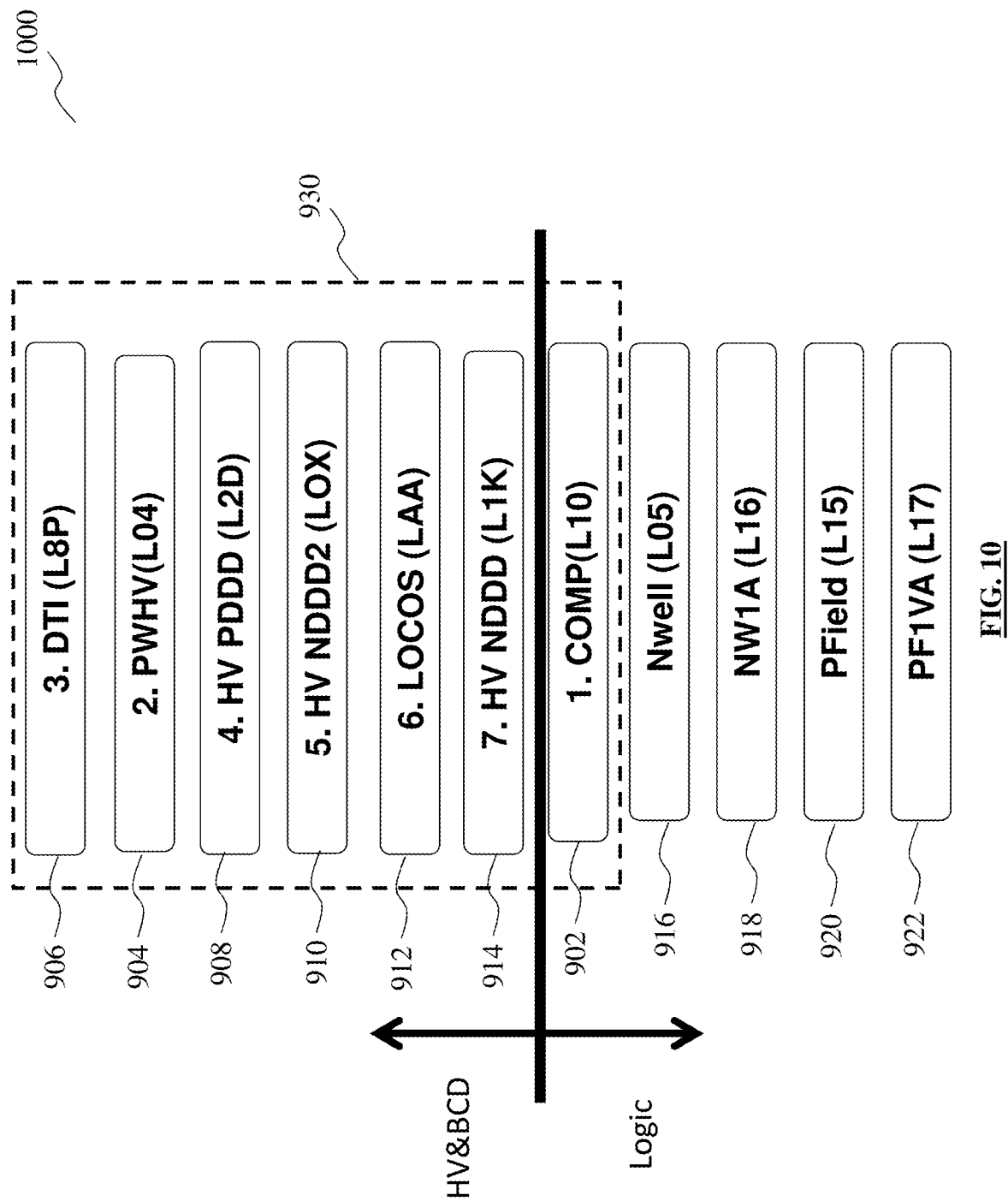
FIG. 10 illustrates a flow diagram of a method of fabricating a DTI structure according to various non-limiting embodiments.

FIG. 10 illustrates a flow diagram 1000 of a method of fabricating a DTI structure according to various non-limiting embodiments. The method described herein may differ from the prior art method described with respect to FIG. 9, in that the processes in the box 930 may be carried out in a different sequential order. The first process may be process 906, to form the DTI structures. The DTI structures, instead of the STI regions, may serve as a zero-alignment mask for the subsequent processes relating to the fabrication of the transistors. Process 906 may be followed by processes 904, 908, 910, 912 and 914 to fabricate the HV device. Process 902 may be carried out after fabrication of the HV device, to form the STI regions. In this method, the HV and Bipolar CMOS DMOS (BCD) processes may be carried out first, before the logic processes 902, 916, 918, 920 and 922 are carried out. In other words, the transistors may be fabricated before carrying out the logic processes. As compared to the prior art method, this method may have the advantage that there is no side-effect for the logic processes caused by the process of forming the DTI structures.

FIG. 11 illustrates a flow diagram 1100 of a method of fabricating a DTI structure according to various non-limiting embodiments. The method may include elements 1102 and 1104. Element 1102 may include forming a deep trench that extends from a first portion of the semiconductor substrate to a second portion of the semiconductor substrate. The second portion may underlie the first portion. Element 1104 may include forming an insulator region that includes at least one shallow trench in the first portion of the semiconductor substrate. The insulator region may at least substantially line sides of the deep trench. At least a portion of the at least one shallow trench may be arranged over at least a portion of the deep trench.

In other words, according to various non-limiting embodiments, a method of fabricating a semiconductor device that includes at least one DTI structure, may include elements 1102 and 1104. The semiconductor device may include a semiconductor substrate, for example the substrate 302. The semiconductor substrate may include a first portion and a second portion. The first portion may be provided above the second portion. The first portion may be, for example, the first portion 880. The second portion may be, for example, the second portion 882. Element 1102 may include forming a deep trench, for example, the deep trench 312. The deep trench may extend from the first portion, for example the first portion 880, to the second portion, for example the second portion 882. In other words, an opening of the deep trench may be formed in the first portion and the deep trench may terminate in the second portion. The opening, or the opening end of the deep trench may be referred herein as a top end. The opposite end to the top end, i.e. the end where the deep trench terminates in the second portion, may be referred herein as a terminating end. The deep trench may be filled with a conductive material, for example, doped polysilicon. Element 1104 may include forming the insulator region, which may be the insulator region 308. The insulator region may include, or may consist of, an electrically insulating material, for example, silicon dioxide. The insulator region 308 may include one or more shallow trenches, each of which may lie within the first portion. The shallow trench may be for example, the shallow trench 320. The insulator region may at least substantially cover inner walls of the deep trench. The insulator region may extend from a first end to a second end opposite to the first end. The first end may be coplanar with the top end of the deep trench. The shallow trench may be formed in the semiconductor substrate only after the deep trench is formed and after the deep trench is filled with the conductive material. The shallow trench may be formed by etching the semiconductor substrate using the deep trench as a zero-alignment mask. The shallow trench may be formed at least partially offset from a centerline of the deep trench that connects the top end and the terminating end. As a result, the shallow trench may partially intrude into the deep trench at the top end. The shallow trench may be arranged in the first end of the insulator region, such that the first end of the insulator region is wider than the second end of the insulator region. A mid-section of the deep trench that is between the terminating end and the top end may be wider than the top end.

The following examples pertain to further embodiments.

Example 1 is a semiconductor device. The semiconductor device may include: a semiconductor substrate; a deep trench extending from a first portion of the semiconductor substrate to a second portion of the semiconductor substrate, wherein the second portion underlies the first portion; and an insulator region at least substantially lining sides of the deep trench; wherein the insulator region includes at least one shallow trench in the first portion of the semiconductor substrate; wherein at least a portion of the at least one shallow trench is arranged over at least a portion of the deep trench.

In example 2, the subject-matter of example 1 may optionally include that the deep trench is filled with a conductive material.

In example 3, the subject-matter of example 2 may optionally include that the conductive material is doped polysilicon.

In example 4, the subject-matter of any one of examples 1 to 3 may optionally include that the insulator region includes silicon dioxide.

In example 5, the subject-matter of any one of examples 1 to 4 may optionally include that a terminating end of the deep trench within the second portion is wider than a top end of the deep trench in the first portion.

In example 6, the subject-matter of any one of examples 1 to 5 may optionally include that a mid-section of the deep trench is between a terminating end of the deep trench within the second portion and a top end of the deep trench in the first portion; wherein the mid-section is wider than the top end of the deep trench.

In example 7, the subject-matter of any one of examples 1 to 6 may optionally include that the insulator region extends from a first end coplanar with a top end of the deep trench in the first portion, to a second end opposite to the first end, wherein the first end is wider than the second end.

In example 8, the subject-matter of example 7 may optionally include that the at least one shallow trench is arranged in the first end of the insulator region.

In example 9, the subject-matter of any one of examples 1 to 8 may optionally include that the deep trench has a depth ranging from 4 um to 30 um.

In example 10, the subject-matter of any one of examples 1 to 9 may optionally include that the deep trench has a diameter ranging from 0.5 um to 3 um.

In example 11, the subject-matter of any one of examples 1 to 10 may optionally include that the at least one shallow trench has a depth ranging from 0.028 um to 0.25 um.

In example 12, the subject-matter of any one of examples 1 to 11 may optionally include that the at least one shallow trench has a diameter ranging from 0.028 um to 0.25 um.

In example 13, the subject-matter of any one of examples 1 to 12 may optionally include that the first portion is lightly doped.

In example 14, the subject-matter of any one of examples 1 to 13 may optionally include that the second portion is heavily doped.

In example 15, the subject-matter of any one of examples 1 to 14 may optionally include that the at least one shallow trench includes two shallow trenches, wherein the deep trench is arranged between the two shallow trenches.

Example 16 is a method of fabricating a deep trench isolation structure in a semiconductor substrate. The method may include: forming a deep trench, the deep trench extending from a first portion of the semiconductor substrate to a second portion of the semiconductor substrate, wherein the second portion underlies the first portion; and forming an insulator region at least substantially lining sides of the deep trench; wherein the insulator region includes at least one shallow trench in the first portion of the semiconductor substrate; wherein at least a portion of the at least one shallow trench is arranged over at least a portion of the deep trench.

In example 17, the subject-matter of example 16 may optionally include that forming the insulator region includes forming the at least one shallow trench after forming the deep trench.

In example 18, the subject-matter of example 17 may optionally include that forming the at least one shallow trench includes using the deep trench as a zero-alignment mask to etch the semiconductor substrate.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A semiconductor device comprising:
   a semiconductor substrate;
   a deep trench extending from a first portion of the semiconductor substrate to a second portion of the semiconductor substrate, wherein the second portion underlies the first portion, wherein the deep trench has a top end in the first portion and an opposite terminating end in the second portion; and an insulator region at least substantially lining sides of the deep trench;

wherein the insulator region comprises at least one shallow trench in the first portion of the semiconductor substrate;

wherein at least a portion of the at least one shallow trench is arranged horizontally beside at least a portion of the deep trench; and wherein the deep trench is filled with a conductive material, and the insulator region and the at least one shallow trench are filled with an insulator material, wherein the at least one shallow trench has a first end and an opposite second end, the first end being wider than the second end;

wherein the first end of the at least one shallow trench is adjacent to the top end of the deep trench, and wherein the second end of the at least one shallow trench is adjacent to a mid-section of the deep trench between the terminating end and the top end of the deep trench, such that the top end of the deep trench is narrower than the mid-section of the deep trench.

2. The semiconductor device of claim 1, wherein the conductive material is doped polysilicon.

3. The semiconductor device of claim 1, wherein the insulator region comprises silicon dioxide.

4. The semiconductor device of claim 1, wherein the terminating end of the deep trench within the second portion is wider than the top end of the deep trench in the first portion.

5. The semiconductor device of claim 1, wherein a mid-section of the deep trench is between the terminating end of the deep trench within the second portion and the top end of the deep trench in the first portion; wherein the mid-section is wider than the top end of the deep trench.

6. The semiconductor device of claim 5, wherein the mid-section is wider than the terminating end of the deep trench and wherein the mid-section is nearer to the top end of the deep trench than the terminating end of the deep trench.

7. The semiconductor device of claim 1, wherein the insulator region extends from a first end coplanar with the top end of the deep trench in the first portion, to a second end opposite to the first end, wherein the first end is wider than the second end.

8. The semiconductor device of claim 7, wherein the at least one shallow trench is arranged in the first end of the insulator region.

9. The semiconductor device of claim 1, wherein the deep trench has a depth ranging from 4 um to 30 um.

10. The semiconductor device of claim 1, wherein the deep trench has a diameter ranging from 0.5 um to 3 um.

11. The semiconductor device of claim 1, wherein the at least one shallow trench has a depth ranging from 0.028 um to 0.25 um.

12. The semiconductor device of claim 1, wherein the at least one shallow trench has a diameter ranging from 0.028 um to 0.25 um.

13. The semiconductor device of claim 1, wherein the first portion is lightly doped.

14. The semiconductor device of claim 1, wherein the second portion is heavily doped.

15. The semiconductor device of claim 1, wherein the at least one shallow trench comprises two shallow trenches, and wherein the deep trench is arranged between the two shallow trenches.

16. The semiconductor device of claim 1, wherein
wherein the mid-section is wider than the top end of the deep trench and the terminating end of the deep trench.

17. The semiconductor device of claim 1, wherein the conductive material of the deep trench contacts the second portion of the semiconductor substrate at the terminating end of the deep trench.

18. A method of fabricating a deep trench isolation structure in a semiconductor substrate, the method comprising:

forming a deep trench, the deep trench extending from a first portion of the semiconductor substrate to a second portion of the semiconductor substrate, wherein the second portion underlies the first portion, wherein the deep trench has a top end in the first portion and an opposite terminating end in the second portion; and forming an insulator region at least substantially lining sides of the deep trench;

wherein the insulator region comprises at least one shallow trench in the first portion of the semiconductor substrate;

wherein at least a portion of the at least one shallow trench is arranged horizontally beside at least a portion of the deep trench;

wherein the deep trench is filled with a conductive material, and the insulator region and the at least one shallow trench are filled with an insulator material, wherein the at least one shallow trench has a first end and an opposite second end, the first end being wider than the second end;

wherein the first end of the at least one shallow trench is adjacent to the top end of the deep trench, and wherein the second end of the at least one shallow trench is adjacent to a mid-section of the deep trench between the terminating end and the top end of the deep trench, such that the top end of the deep trench is narrower than the mid-section of the deep trench.

19. The method of claim 18, wherein forming the insulator region comprises forming the at least one shallow trench after forming the deep trench.

20. The method of claim 19, wherein forming the at least one shallow trench comprises using the deep trench as a zero-alignment mask to etch the semiconductor substrate.

* * * * *